United States Patent
Zhang et al.

(10) Patent No.: US 11,448,065 B2
(45) Date of Patent: Sep. 20, 2022

(54) DIGITAL SIGNAL PROCESSING IN MUD PULSE TELEMETRY

(71) Applicant: Halliburton Energy Services, Inc., Houston, TX (US)

(72) Inventors: Yumin Zhang, Allen, TX (US); Ehud Barak, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 16/815,262

(22) Filed: Mar. 11, 2020

(65) Prior Publication Data
US 2020/0208512 A1 Jul. 2, 2020

Related U.S. Application Data

(62) Division of application No. 15/519,528, filed as application No. PCT/US2014/069545 on Dec. 10, 2014, now Pat. No. 10,619,479.

(51) Int. Cl.
*E21B 47/20* (2012.01)
*E21B 47/18* (2012.01)
(Continued)

(52) U.S. Cl.
CPC ............. *E21B 47/20* (2020.05); *E21B 7/046* (2013.01); *E21B 47/06* (2013.01); *E21B 47/18* (2013.01);
(Continued)

(58) Field of Classification Search
CPC .......... E21B 47/12; E21B 47/20; E21B 47/06; E21B 47/18; E21B 47/22; E21B 47/24;
(Continued)

(56) References Cited

U.S. PATENT DOCUMENTS

| 4,821,035 A | 4/1989 | Hanson et al. |
| 6,920,085 B2 * | 7/2005 | Finke ...................... E21B 47/22 367/83 |

(Continued)

FOREIGN PATENT DOCUMENTS

WO 2009008862 A1 1/2009

OTHER PUBLICATIONS

AR Application Serial No. 20150103344, Office Action, dated Jan. 8, 2020, 3 pages.

(Continued)

*Primary Examiner* — Franklin D Balseca
(74) *Attorney, Agent, or Firm* — Delizio, Peacock, Lewin & Guerra

(57) ABSTRACT

Digital signal processing for mud pulse telemetry utilizes a variety of "On/Off" keying based modulation schemes, such as pulse width modulation (PWM) and pulse position modulation (PPM), to encode and/or decode information. A combination of PPM and PWM is disclosed that increases a bit rate while keeping a chip rate unchanged. The combination of PPM and PWM comprises determining a drilling condition and forming a message based on the drilling condition, forming a string of symbol values comprising the message, identifying a pulse width and a pulse start for the pulse based on a symbol value, providing a first pulse at a selected chip location, providing subsequent pulses to form the pulse width, and forming a quiet period at the end of the pulse width.

20 Claims, 6 Drawing Sheets

(51) Int. Cl.
  *E21B 7/04* (2006.01)
  *E21B 47/06* (2012.01)
  *H03K 7/04* (2006.01)
  *H03K 7/08* (2006.01)
  *H03K 9/04* (2006.01)
  *H03K 9/08* (2006.01)
  *E21B 44/06* (2006.01)

(52) U.S. Cl.
  CPC ............. *E21B 44/06* (2013.01); *H03K 7/04* (2013.01); *H03K 7/08* (2013.01); *H03K 9/04* (2013.01); *H03K 9/08* (2013.01)

(58) Field of Classification Search
  CPC ........... E21B 7/046; E21B 44/06; H03K 7/04; H03K 7/08; H03K 9/04; H03K 9/08
  See application file for complete search history.

(56) References Cited

U.S. PATENT DOCUMENTS

| | | | | |
|---|---|---|---|---|
| 7,054,296 | B1* | 5/2006 | Sorrells | H04B 1/406 370/338 |
| 8,350,715 | B2* | 1/2013 | Shearer | H04L 25/4902 340/853.3 |
| 9,222,352 | B2 | 12/2015 | Hoefel et al. | |
| 2003/0016164 | A1 | 1/2003 | Finke et al. | |
| 2009/0199072 | A1 | 8/2009 | Akimov et al. | |
| 2009/0285264 | A1 | 11/2009 | Aldana et al. | |
| 2010/0188253 | A1 | 7/2010 | Shearer | |
| 2010/0195442 | A1 | 8/2010 | Reyes et al. | |
| 2011/0286308 | A1 | 11/2011 | Sugiura | |
| 2013/0093597 | A1 | 4/2013 | Stolpman | |
| 2014/0254728 | A1* | 9/2014 | Jones | H04L 27/366 375/341 |

OTHER PUBLICATIONS

AU Application No. 2014413658; Notice of Acceptance for Patent Application, dated Nov. 27, 2018, 3 pages.
CA Application Serial No. 2,965,787, Office Action 1, dated Jan. 31, 2019, 6 pages.
CA Application Serial No. 2,965,787, Office Action 2, dated Jan. 23, 2020, 6 pages.
ID Application Serial No. PID201703038, Office Action, dated Mar. 3, 2020, 4 pages.
PCT/US2014/069545 International Search Report, dated Aug. 26, 2015, 3 pages.
PCT/US2014/069545 Written Opinion, dated Aug. 26, 2015, 8 pages.
U.S. Appl. No. 15/519,528, Final Office Action, dated Mar. 15, 2019, 12 pages.
U.S. Appl. No. 15/519,528, Non Final Office Action, dated Jul. 25, 2018, 11 pages.
U.S. Appl. No. 15/519,528, Notice of Allowance, dated Dec. 2, 2019, 13 pages.
U.S. Appl. No. 15/519,528, Restriction Requirement, dated Apr. 2, 2018, 6 pages.
AU Application No. 2014413658, Examination Report No. 1, dated Apr. 18, 2018, 4 pages.
AU Application No. 2014413658; Examination Report; dated Aug. 22, 2018, 5 pages.
IN Application Serial No. 201717012915; First Exam Report; dated Aug. 5, 2019, 6 pages.

* cited by examiner

DIGITAL SIGNAL PROCESSING IN MUD PULSE TELEMETRY

BACKGROUND

In the field of oil and gas exploration and extraction, pressure sensors are customarily used at the surface for reading data provided by acoustic transducers at the downhole. The data travels through the drilling mud along the wellbore. There are many modulation schemes that can be used to encode the data. Some of the modulation schemes using pulses include Pulse Position Modulation (PPM), Differential Pulse Position Modulation (DPPM), and Pulse Width Modulation (PWM). In these and other modulation schemes data packets are divided into symbols. Each symbol is divided to fixed intervals called "chips". Each symbol includes at least one period of '1's that makes a pulse. In PPM, the data is encoded by the position of the pulse in the symbol. In DPPM, data is encoded in the distance from the previous pulse. In PWM the information is encoded in the width of the pulse. In the above, position, distance, and width are measured as integer numbers of 'chips.' The amount of information transmitted increases with the symbol length. But the time it takes for transmitting the signal also increases with symbol length, leaving the transmission rate unchanged, if not reduced, with increased symbol length. Attempts to increase transmission rates have focused on improving acoustic transducer hardware, such as for example reducing a recovery time of acoustic emitters and detectors. However, this approach is expensive and provides slow progress with marginal improvements. Other approaches attempt to reduce the chip-width and increase the symbol rate. However, these methods are limited by the available Signal to Noise Ratio (SNR). When the chip rate increases, pulses become narrower and this reduces the SNR of the data transmission, increasing the Bit Error Rate (BER).

BRIEF DESCRIPTION OF THE DRAWINGS

The following figures are included to illustrate certain aspects of the present disclosure and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
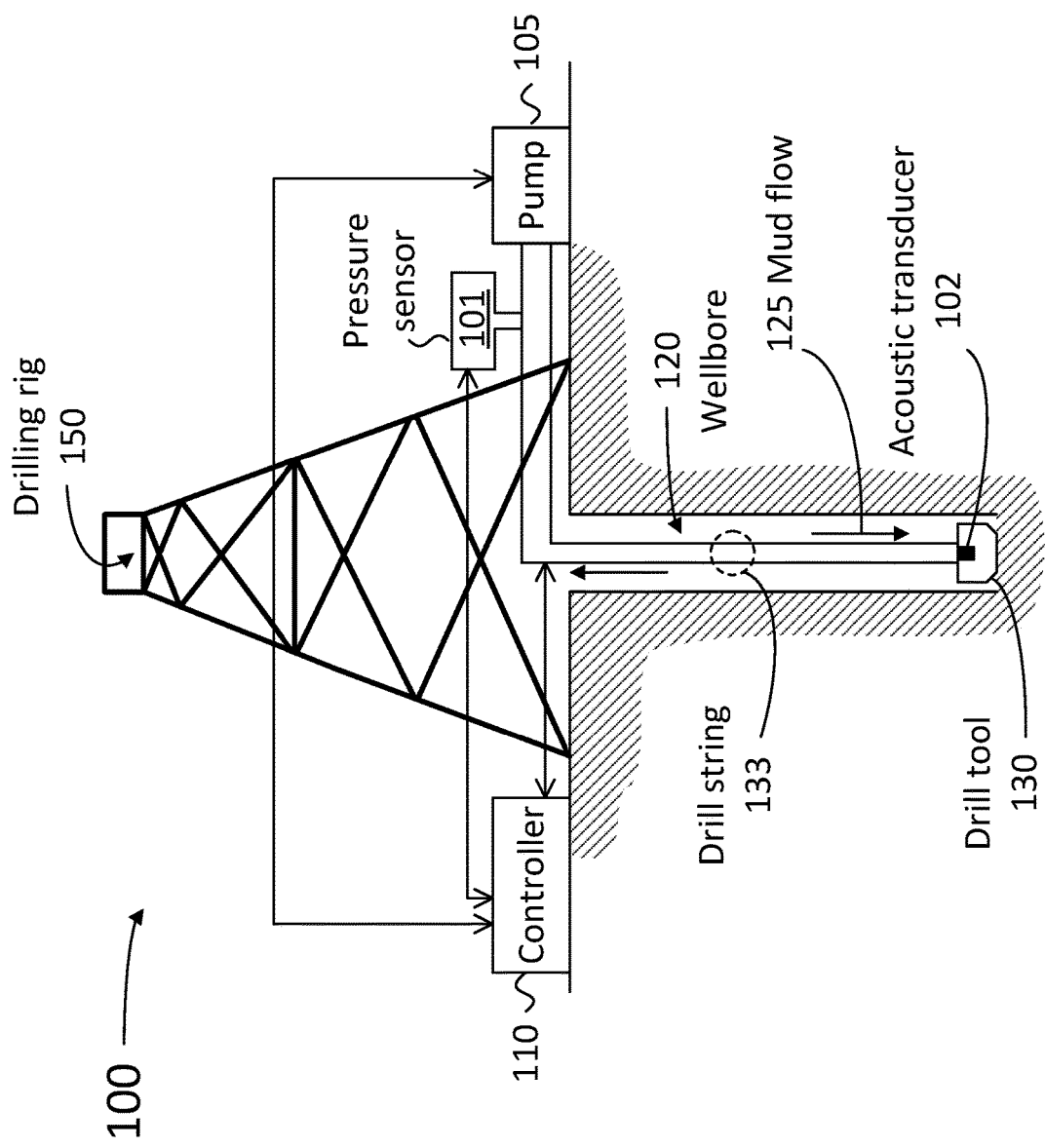
FIG. 1 illustrates a drilling system using a pressure sensor configured to transmit data for digital signal processing in mud pulse telemetry, according to some embodiments.

The present disclosure relates to methods and devices for telemetry schemes used in oil and gas exploration and extraction and, more particularly, to methods and devices for digital signal processing in mud pulse telemetry. Accordingly, embodiments disclosed herein provide modulation schemes with a symbol mapping that increases the data rate for mud pulse telemetry, also decreasing the bit error rate (BER) at the receiver.

In mud pulse telemetry, one popular type of 'On/Off' Keying based (OOK) modulation scheme is pulse position modulation (PPM). In PPM schemes, a data symbol has a fixed duration, and the pulse location within the symbol period indicates the symbol value. Other techniques applicable in embodiments consistent with the present disclosure include, without limitation, pulse width modulation (PWM) schemes. In PWM schemes, a data symbol is associated with a time duration of a sequence of pulses, therefore the data transmission includes a variable number of consecutive pulses in each data packet. Typically, a Bit Error Rate (BER) and the data rate of signals transmitted in mud pulse telemetry are affected by physical constraints in the acoustic transducers that create and read the signals. Embodiments disclosed herein increase the bit rate by using a combination of PPM and PWM while keeping the chip rate unchanged.

For example, acoustic transducers typically have a response time determined by a charging/de-charging time of a capacitor in the circuit that creates the acoustic pulses. This delay creates a minimum time interval between two consecutive pulses. Furthermore, each acoustic pulse itself has a minimum time duration also related to the time response of the acoustic transducer and the bandwidth of the acoustic channel formed by the mud flow. Another factor that enters into consideration is a limited total number of pulses through the lifetime of an acoustic transducer and its limited response time. Thus, signaling schemes as disclosed herein make optimal use of the limited number of pulses generated by the acoustic transducer. These constraints are exacerbated in current drilling configurations, where the acoustic transducer may be as far as 5000 feet (ft), 10000 ft, 20000 ft, or even 30000 ft below the surface, in any drilling configuration. Accordingly, embodiments as disclosed herein are configured to work at each of the above different depths, without a substantial change in performance.

In the present disclosure, systems and methods for digital signal processing for mud pulse telemetry are provided. A method consistent with embodiments herein may include identifying a symbol in a pulse sequence, identifying a pulse width for a pulse in the symbol and identifying a pulse start for the pulse in the symbol. The method may further include determining a symbol value based on the pulse width and the pulse start, reading a message using the symbol value for each symbol in a string of symbols, and modifying a drilling configuration according to the message. In yet other embodiments, a method includes mapping a symbol in a pulse sequence by using a pulse width and a pulse start in the symbol, reading a message using a symbol value for each symbol in a string of symbols, and modifying a drilling configuration according to the message.

A device according to some embodiments includes a memory circuit storing commands and a processor circuit configured to execute the commands. When the processor circuit executes the commands, it causes the device to identify a symbol in a pulse sequence, associate the symbol with a symbol value using a one-to-one correspondence between the symbol value and a symbol characteristic, and read a message using the symbol value for each symbol in a string of symbols. Furthermore, the device may be configured to modify a drilling configuration according to the message.

A method according to some embodiments includes determining a drilling condition and forming a message based on the drilling condition. The method further includes forming a string of symbol values comprising the message. The method may also include identifying a pulse width and a pulse start for the pulse, based on a symbol value, providing a first pulse at a selected chip location, and providing subsequent pulses to form the pulse width. In some embodiments, the method includes forming a quiet period at the end of the pulse width for each symbol.

FIG. 1 illustrates a drilling system 100 using a pressure sensor 101 configured to suppress pulse reflections in a pulse modulation telemetry configuration, according to some embodiments. Drill system 100 may be a logging while drilling (LWD) system, as is well known in the oil and gas industry. A pump 105 maintains mud flow 125 down a wellbore 120 dug by a drill tool 130. A drill string 133 couples drill tool 130 with equipment on the surface, such as pump 105 and pressure sensor 101. The tools are supported by drilling rig 150. A controller 110 is coupled to pressure sensor 101, to pump 105, and to acoustic transducer 102 via wellbore 120. Controller 110 may include a computer system configured to receive data from and transmit commands to pressure sensor 101, to acoustic transducer 102, and to pump 105.

Mounted near drill tool 130, an acoustic transducer 102 is configured to transmit to and receive messages from the surface with information related to the drill process. Messages created by acoustic transducer 102 may be digitally encoded sequences of acoustic pulses transmitted through mud flow 125 and read by pressure sensor 101. Accordingly, a plurality of digital signal modulation techniques may be used to transmit messages between acoustic transducer 102 and pressure sensor 101, such as PPM and PWM. As a response to the messages transmitted between pressure sensor 101 and acoustic transducer 102, controller 110 may adjust a drilling configuration in drilling system 100. For example, a drilling speed may be increased, reduced, or stopped by controller 110, based on messages received from acoustic transducer 102. Moreover, in some embodiments controller 110 may cause drill tool 130 to steer in a different direction. For example, in some embodiments drill tool 130 may be steered from a vertical drilling configuration (as shown in FIG. 1) to a horizontal or almost horizontal drilling configuration. In some embodiments, adjusting the drilling configuration may include adjusting mud flow 125. For example, mud flow 125 may be increased or reduced, or the pressure exerted by pump 105 may be increased or reduced. Moreover, in some embodiments adjusting the drilling configuration may include adding chemicals and other additives to mud flow 125, or removing additives from mud flow 125.

Figure 2:
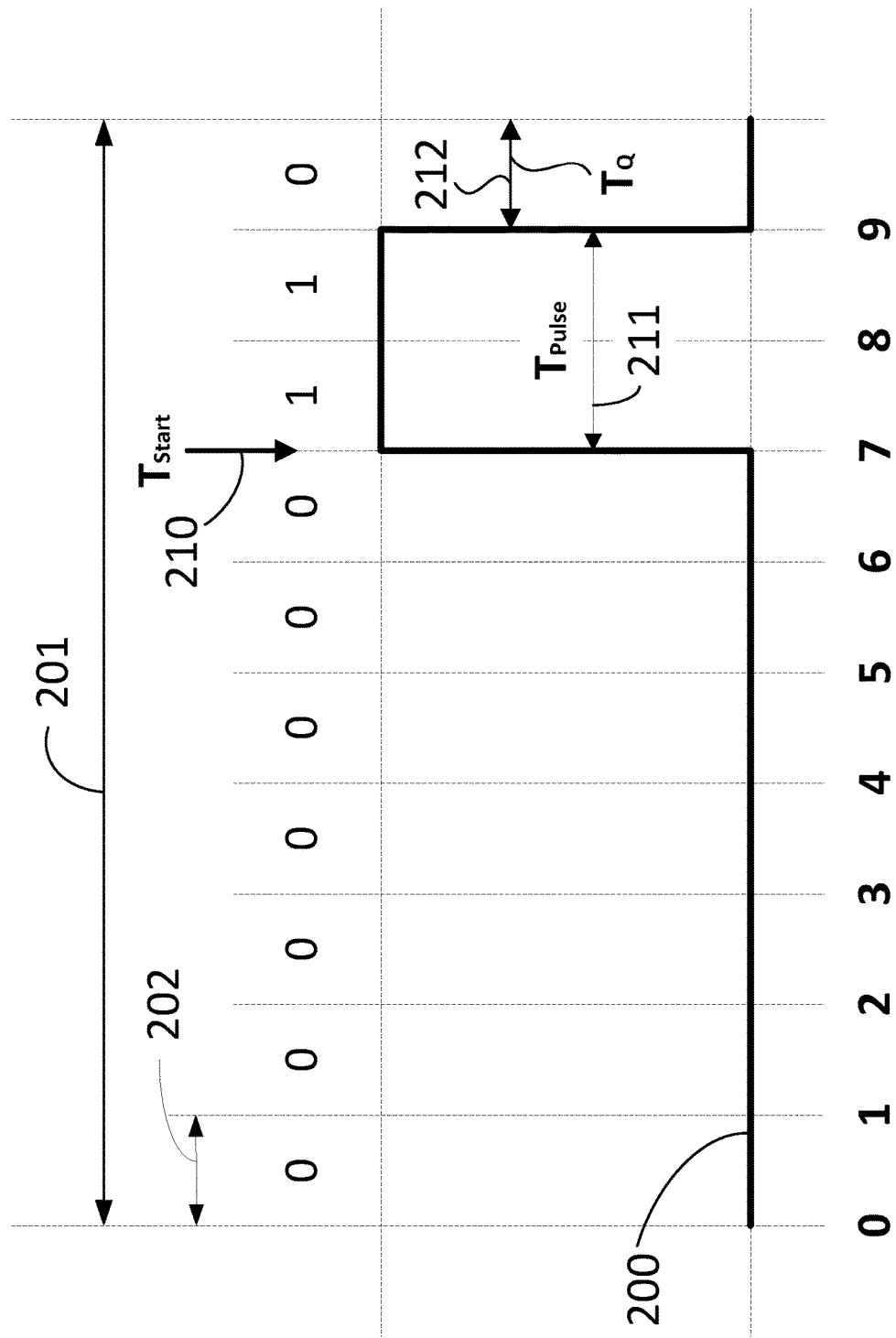
FIG. 2 illustrates a pulse position modulation waveform (PPM) scheme in a digital signal processing method, according to some embodiments.

FIG. 2 illustrates a pulse position modulation (PPM) waveform 200 in a digital signal processing method, according to some embodiments. PPM waveform 200 corresponds to a symbol in a digital signal processing scheme. The symbol spans a period of time $T_{symbol}$ 201 which is divided into an integer number of sub-periods, or 'chips,' each spanning a time $T_{chip}$ 202. The parameters used to describe PPM waveform 200 are K, $T_{pulse}$ 211, and $T_q$ 212. The parameter K indicates the number of bits in one symbol. Parameter $T_{pulse}$ 211 is the pulse width. Parameter $T_q$ 212 is a "quiet period" before start of a new symbol. Tq 212 allows for the recovery of the physical mechanism of the transducer producing and detecting the pulses before a new symbol is started. In embodiments used for mud pulse telemetry, $T_q$ 212 indicates a period of time where a mud pulser valve in pressure sensor 101 or acoustic transducer 102 is in the rest position (cf. FIG. 1). In some embodiments, $T_q$ 212 equals the recharging time for a battery or a capacitor in pressure sensor 101 or acoustic transducer 102, before another pulser open (for negative pulser) or close (for positive pulser) action is made. A value $T_{start}$ 210 indicates the time within $T_{symbol}$ 201 at which the pulse starts. Hereinafter, time values such as $T_{symbol}$ 201, $T_{pulse}$ 211, Tq 212, and $T_{start}$ 210 will be given in integer values representing a number of periods $T_{chip}$ 202 in each time interval, as the unit of time.

FIG. 2 shows a PPM waveform 200 with $T_{symbol}$ 201 is equal to 10, K is equal to three (3), $T_{pulse}$ 211 is equal to two (2), and $T_q$ 212 is equal to one (1). The pulse in PPM waveform 200 is positive, although negative pulses may also be used without departing from the scope of the present disclosure. The positive pulse occurs at beginning of the 7th chip, thus $T_{start}$ 210 is equal to seven (7). A binary sequence 0000000110 describes PPM waveform 200. The last three bits in the binary sequence, "110" represent the pulse shape in PPM waveform 200. Accordingly, the number of values for $T_{start}$ 210 in FIG. 2 is eight (8). That is, a symbol in PPM waveform 200 may take any of eight values, which in binary code corresponds to a three bit number string (K=3).

Table 1 illustrates an exemplary embodiment where $T_{symbol}$ 201 is equal to seven (7), $T_{pulse}$ 211 is equal to three (3), and $T_q$ 212 is equal to one (1). Using a PPM modulation as in FIG. 1, Table 1 lists the binary sequence representation for the original PPM modulation waveforms and the corresponding symbol values. Accordingly, the corresponding binary bit string has K equal to 2 (two).

TABLE 1

| PPM Waveforms | Symbol Values (Binary Bits) |
|---|---|
| 1110000 | 0(00) |
| 0111000 | 1(01) |
| 0011100 | 2(10) |
| 0001110 | 3(11) |

To improve throughput, some embodiments encode more bits within the same $T_{symbol}$ 201 by varying $T_{pulse}$ 211, thus combining a PPM and a PWM scheme. To simplify the transmission protocol and to accommodate for physical sensor limitations in terms of response speed and sensitivity, some embodiments have a minimum value for $T_{pulse}$ 211. Likewise, some embodiments include a single, continuous sequence of pulses per symbol and a minimum value $T_q$ 212 of 1 (one), for all symbols. Accordingly, in some embodiments $T_{pulse}$ 211 may take values from a minimum value up to $T_{symbol}-T_q$. This scheme provides a wider selection of waveforms within $T_{symbol}$ 201. Each waveform within the new scheme can be assigned a unique symbol value. Accordingly, the combination of PWM with PPM produces a more robust and powerful signal encoding scheme.

Figure 3:
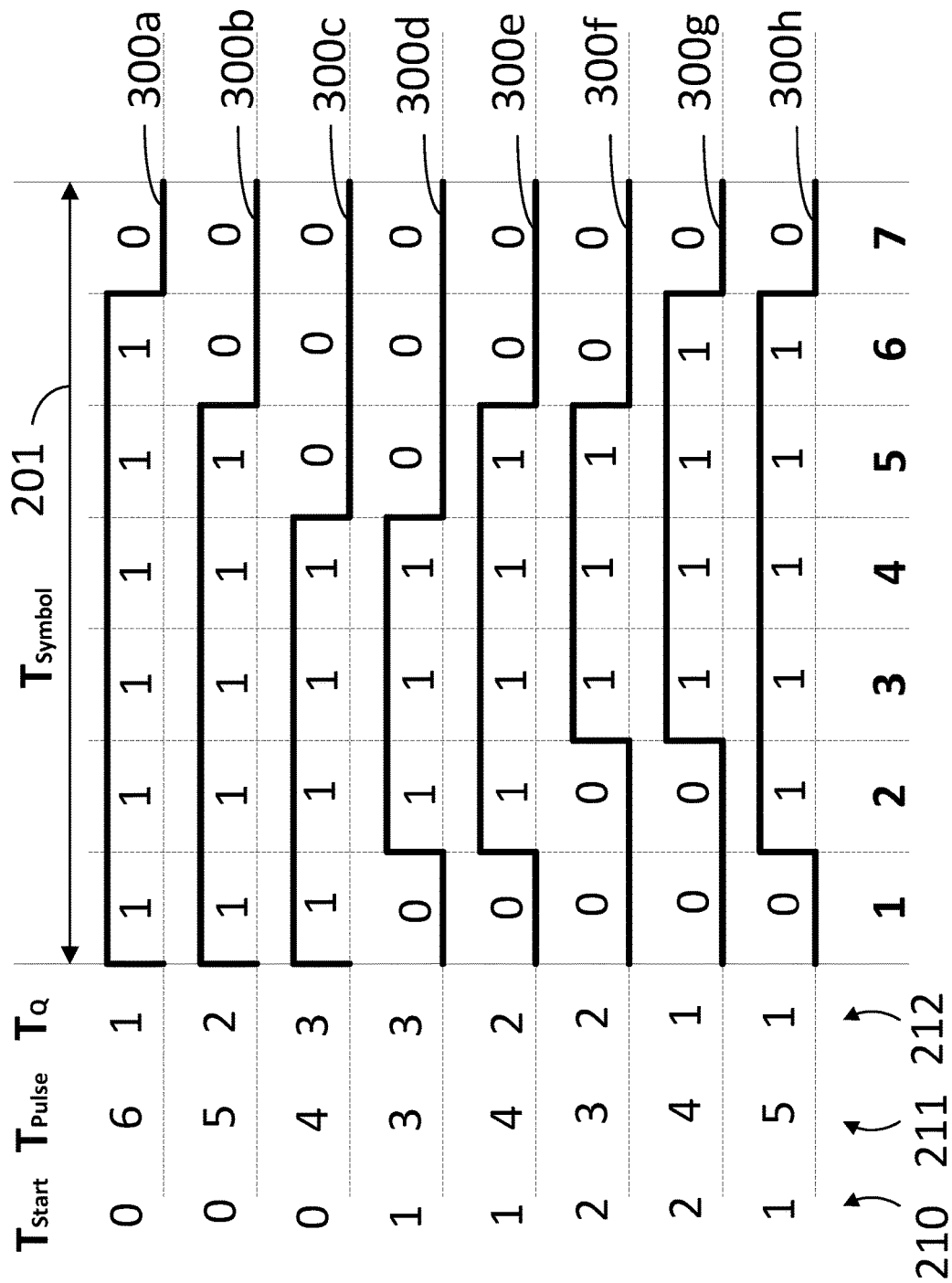
FIG. 3 illustrates a plurality of waveforms including pulse position modulation (PPM) scheme and pulse width modulation (PWM) scheme in a Gray mapping configuration for digital signal processing in mud pulse telemetry, according to some embodiments.

FIG. 3 illustrates a plurality of waveforms 300a-h, including PPM and PWM in schemes in a Gray mapping configuration for digital signal processing in mud pulse telemetry, according to some embodiments. Each one of waveforms 300a-h has a different combination of values for $T_{start}$ 210 and $T_{pulse}$ 211 (cf. FIG. 2). In particular, each one of waveforms 300a-h has a value Tpulse≥3, and a value $T_q$≥1. Waveforms 300a-h are selected according to a 'Gray' coding scheme in addition to a combination of PPM and PWM schemes. In a 'Gray' coding scheme, waveforms within $T_{symbol}$ 201 differing by only 1 chip are assigned symbol values that only differ by 1 binary bit. By using Gray coding, when the most likely error happens (i.e., one chip error), the symbol error only corresponds to a 1-bit error.

Accordingly, each one of waveforms 300a-h differs from its immediate neighbor by one chip. For example, waveform 300c differs from waveform 300b in the last chip of the pulse: '0' for waveform 300c, and '1' for waveform 300b. Likewise, waveform 300c differs from waveform 300d in the first chip of the pulse: '1' for waveform 300c, and '0' for waveform 300b. A Gray code scheme reduces the magnitude of the message error, or computational error because of the higher likelihood of single bit mistakes in any data transmission scheme. For example, acoustic reflections and drill tool noise could distort the received pulse shape in drilling system 100 (cf. FIG. 1). Acoustic reflections may erroneously increase $T_{pulse}$ 211 by one chip. It is less likely that acoustic reflections increase $T_{pulse}$ by more than one chip. Therefore, waveform 300c could be mistaken for waveform 300b, or waveform 300d could be mistaken for waveform 300c. The resulting symbol error has minimal impact in the message, as the two mistaken symbols have consecutive value in either case (cf. Table 2). This helps reducing the raw bit error rate and facilitates use of a forward error correction module to correct the remaining errors.

The combined PPM and PWM scheme shown in FIG. 3 uses eight (8) out of ten (10) possible waveforms. Two waveforms are sacrificed in order to satisfy a one-to-one Gray mapping from a waveform to a symbol value. Namely, a waveform having $T_{start}=0$, $T_{pulse}=3$, and $T_q=4$ is not included in FIG. 3, nor in Table 2. Also, a waveform having $T_{start}=3$, $T_{pulse}=3$, and $T_q=1$ is not included in FIG. 3, nor in Table 2. Accordingly, FIG. 3 illustrates that embodiments using a $T_{symbol}$ 201 of seven chips can encode symbols corresponding to a bit string of K=3 in a robust configuration. Table 2 lists the Gray coded, combined PPM and PWM waveforms and associated symbol values. The data rate has increased 50% since for the same symbol period, the embodiment disclosed in Table 2 represents 3 bits (8 symbol values) instead of 2 bits (4 symbol values, cf. Table 2). In addition, the Gray mapping helps to keep bit error rate low.

TABLE 2

| PPM & PWM Waveforms | Symbol Values (Binary Bits) |
| --- | --- |
| 1111110 | 0(000) |
| 1111100 | 1(001) |
| 1111000 | 2(011) |
| 0111000 | 3(010) |
| 0111100 | 4(110) |
| 0011100 | 5(111) |
| 0011110 | 6(101) |
| 0111110 | 7(100) |

Note that in Table 2, due to Gray mapping, symbol 0 (waveform 300a in FIG. 3) and symbol 7 (waveform 300h in FIG. 3) differ by one chip only. One of ordinary skill recognizes that other mappings that achieve the same goal are possible.

Generally speaking, for a PPM scheme with arbitrarily chosen K, $T_{pulse}$ and $T_q$ value, those skilled in the art could apply the above principle to come up with a symbol to waveform mapping table that minimizes raw bit error rate.

Figure 4:
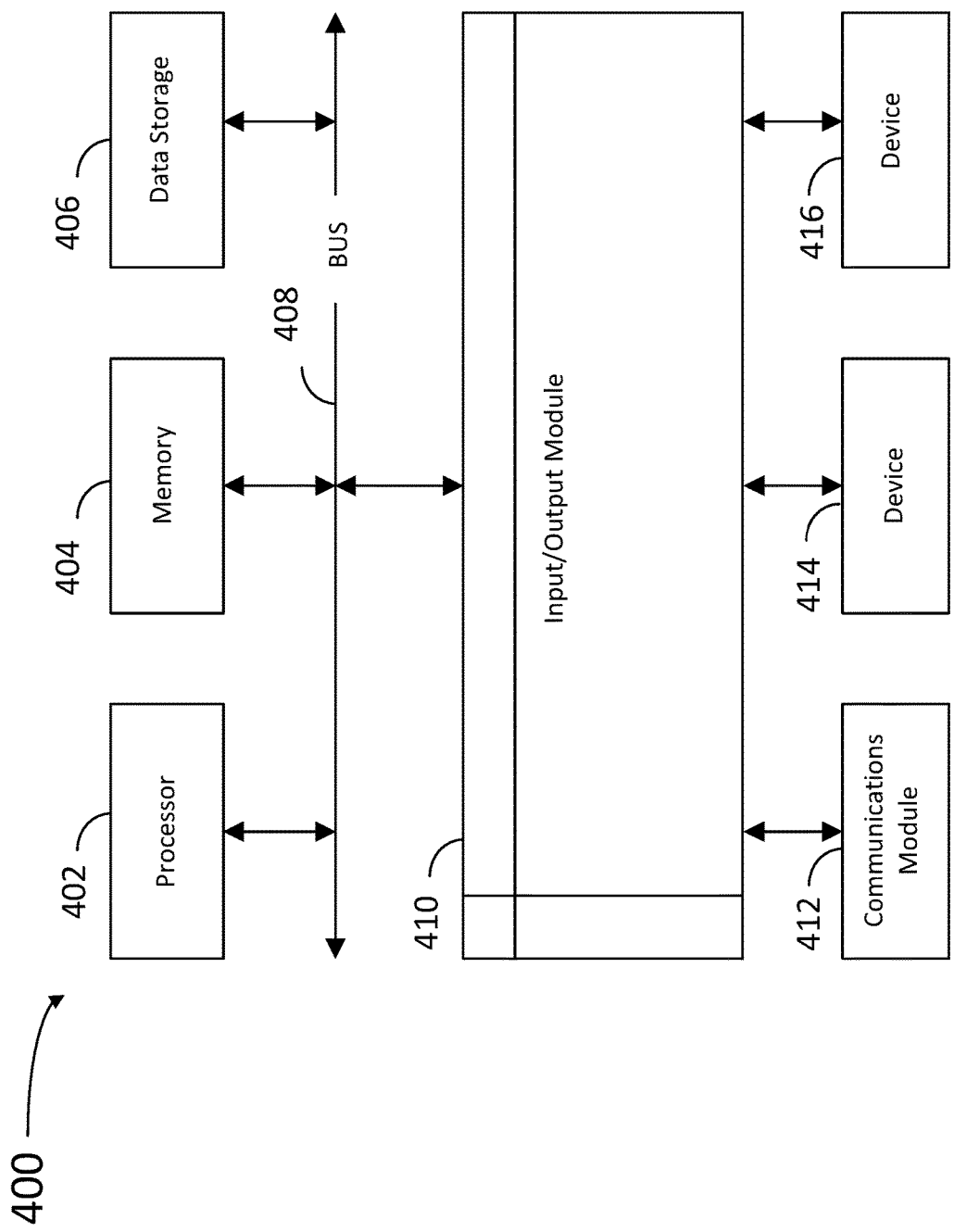
FIG. 4 illustrates a computer system configured for digital signal processing in mud pulse telemetry, according to some embodiments.

FIG. 4 illustrates a computer system 400 configured for digital signal processing in mud pulse telemetry, according to some embodiments. According to one aspect of the present disclosure, computer system 400 may be included in a controller for a drilling system (e.g., controller 110 in drilling system 100, cf. FIG. 1). Computer system 400 includes a processor circuit 402 coupled to a bus 408. Bus 408 may also couple other circuits in computer device 400, such as a memory circuit 404, a data storage 406, an input/output (I/O) module 410, a communications module 412, and peripheral devices 414 and 416. In certain aspects, computer system 400 can be implemented using hardware or a combination of software and hardware, either in a dedicated server, or integrated into another entity, or distributed across multiple entities.

Computer system 400 includes a bus 408 or other communication mechanism for communicating information, and a processor circuit 402 coupled with bus 408 for processing information. By way of example, computer system 400 can be implemented with one or more processor circuits 402. Processor circuit 402 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information.

Computer system 400 includes, in addition to hardware, code that creates an execution environment for the computer program in question, e.g., code that constitutes processor firmware, a protocol stack, a database management system, an operating system, or a combination of one or more of them stored in an included memory circuit 404, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 408 for storing information and instructions to be executed by processor circuit 402. Processor circuit 402 and memory circuit 404 can be supplemented by, or incorporated in, special purpose logic circuitry.

The instructions may be stored in memory circuit 404 and implemented in one or more computer program products, i.e., one or more modules of computer program instructions encoded on a computer readable medium for execution by, or to control the operation of, the computer system 400, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, embeddable languages, and xml-based languages. Memory circuit 404 may also be used for storing temporary variable or other intermediate information during execution of instructions to be executed by processor circuit 402.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 400 further includes a data storage device 406 such as a magnetic disk or optical disk, coupled to bus 408 for storing information and instructions. Computer system 400 is coupled via input/output module 410 to various devices. The input/output module 410 are any input/output module. Example input/output modules 410 include data ports such as USB ports. The input/output module 410 is configured to connect to a communications module 412. Example communications modules 412 include networking interface cards, such as Ethernet cards and modems. In certain aspects, the input/output module 410 is configured to connect to a plurality of devices, such as an input device 414 and/or an output device 416. Example input devices 414 include a keyboard and a pointing device, e.g., a mouse or a trackball, by which a user can provide input to the computer system 400. Other kinds of input devices 414 are used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Example output devices 416 include display devices, such as a LED (light emitting diode), CRT (cathode ray tube), or LCD (liquid crystal display) screen, for displaying information to the user.

Computer system 400 may be configured to perform steps in a method consistent with any of the methods disclosed herein in response to processor circuit 402 executing one or more sequences of one or more instructions contained in memory circuit 404. Such instructions may be read into memory circuit 404 from another machine-readable medium, such as data storage device 406. Execution of the sequences of instructions contained in main memory circuit 404 causes processor circuit 402 to perform the process steps described herein. One or more processors in a multi-processing arrangement may also be employed to execute the sequences of instructions contained in memory circuit 404. In alternative aspects, hard-wired circuitry may be used in place of or in combination with software instructions to implement various aspects of the present disclosure. Thus, aspects of the present disclosure are not limited to any specific combination of hardware circuitry and software.

Figure 5:
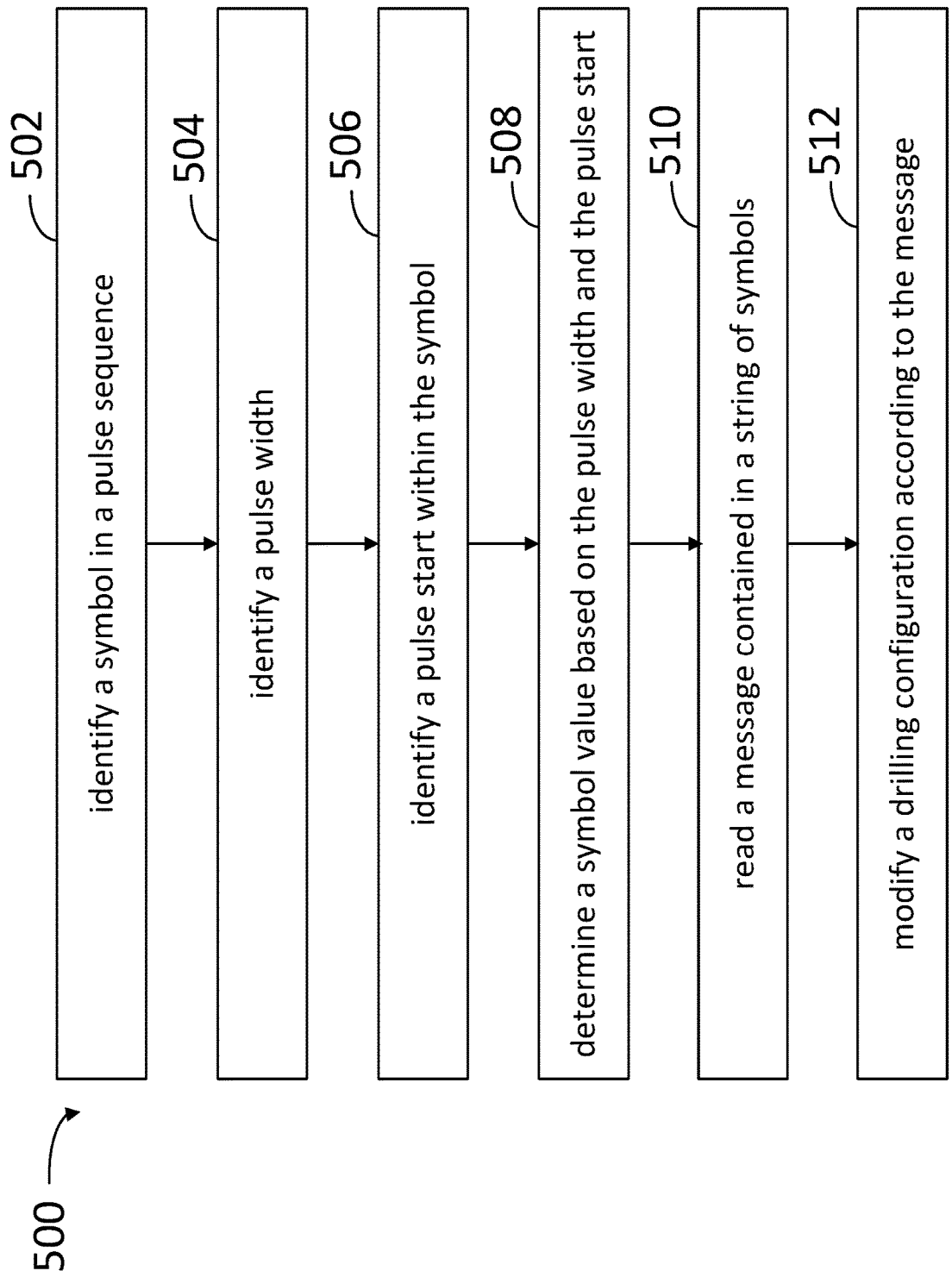
FIG. 5 illustrates a flow chart including steps in a method for digital signal processing in mud pulse telemetry, according to some embodiments.

FIG. 5 illustrates a flow chart including steps in a method 500 for digital signal processing in mud pulse telemetry, according to some embodiments. Some embodiments may include steps in method 500 in the context of adjusting a drilling configuration in a drilling system including a drilling rig supporting a drill string coupled to a drill tool forming an underground wellbore (e.g., drilling system 100, drilling rig 150, drill string 133, drill tool 130, and wellbore 120, cf. FIG. 1). In the drilling system, an acoustic transducer near the drill tool may transmit messages between a controller in the surface and the drill tool (e.g., acoustic transducer 102 and controller 110, cf. FIG. 1). The messages may be transmitted through a mud flow and received at the surface by a pressure sensor, the mud flow being pressurized by a pump at the surface (e.g., mud flow 125, pressure sensor 101, and pump 105, cf. FIG. 1). The messages in method 500 may include a string of symbols having values according to signal processing methods such as Gray code mapping. Specifically, some embodiments of method 500 use PPM and PWM schemes with Gray code mapping. More generally, methods consistent with method 500 may incorporate any digital signal processing protocol used in the telecommunication industry.

The symbols in method 500 may include a waveform having a selected length spanning a period of time $T_{symbol}$ divided into an integer number of sub-periods, or 'chips,' each spanning a time $T_{chip}$ (e.g., $T_{symbol}$ 201 and $T_{chip}$ 202, cf. FIG. 2). Other parameters used to describe waveforms defining symbols in method 500 include a number, K, of bits used by the symbol, a pulse time $T_{pulse}$, and a quiet period $T_q$, after each pulse (e.g., $T_{pulse}$ 211, and $T_q$ 212, cf. FIG. 2).

Steps in methods consistent with method 500 may be at least partially performed by a computer system having a processor circuit executing commands stored in a memory circuit (e.g., computer system 400, processor circuit 402, and memory circuit 404, cf. FIG. 4). Methods consistent with method 500 may include at least one but not all of the steps in FIG. 5, performed in any order. More generally, methods consistent with the present disclosure may include at least some of the steps in FIG. 5 performed overlapping in time. For example, some embodiments may include at least two steps in FIG. 5 performed simultaneously, or almost simultaneously, in time.

Step 502 includes identifying a symbol in a pulse sequence. In some embodiments, step 502 includes identifying a pulse followed by a quiet period. Moreover, in some embodiments step 502 includes finding within a pulse sequence a number of chips forming a symbol, the pulse sequence having a pre-selected configuration. In some embodiments, step 502 includes detecting a pulse sequence using the acoustic transducer, the pulse sequence traveling along the mudflow in the wellbore. Step 504 includes identifying a pulse width from a pulse in the symbol. Accordingly, step 504 may include counting a number of consecutive pulses within the period of time $T_{symbol}$. Step 506 includes identifying the pulse start ($T_{start}$) within the symbol. In some embodiments, step 506 may include identifying a pulse width ($T_{pulse}$) for the pulse in the symbol. Step 508 includes determining a symbol value based on the pulse width and the symbol start. In some embodiments, step 508 includes mapping the symbol value to the pulse width and the pulse start using a Gray code.

Step 510 includes reading a message contained in a string of symbols. In some embodiments, the message may include information regarding the drilling configuration in the drilling system. For example, in some embodiments the information may include a Gas-Oil-Ratio (GOR) of an oil sample in the bottom of the borehole. In some embodiments, the information may include a characteristic of the mud in the mud flow, or a characteristic of the mud flow itself. Step 512 includes modifying a drilling configuration according to the message. In some embodiments, step 512 may include steering the drill tool in the drilling system. For example, step 512 may include steering the drill tool from a vertical drilling configuration to a horizontal drilling configuration. Step 512 may also include adjusting a mud flow parameter, such as pump pressure.

Figure 6:
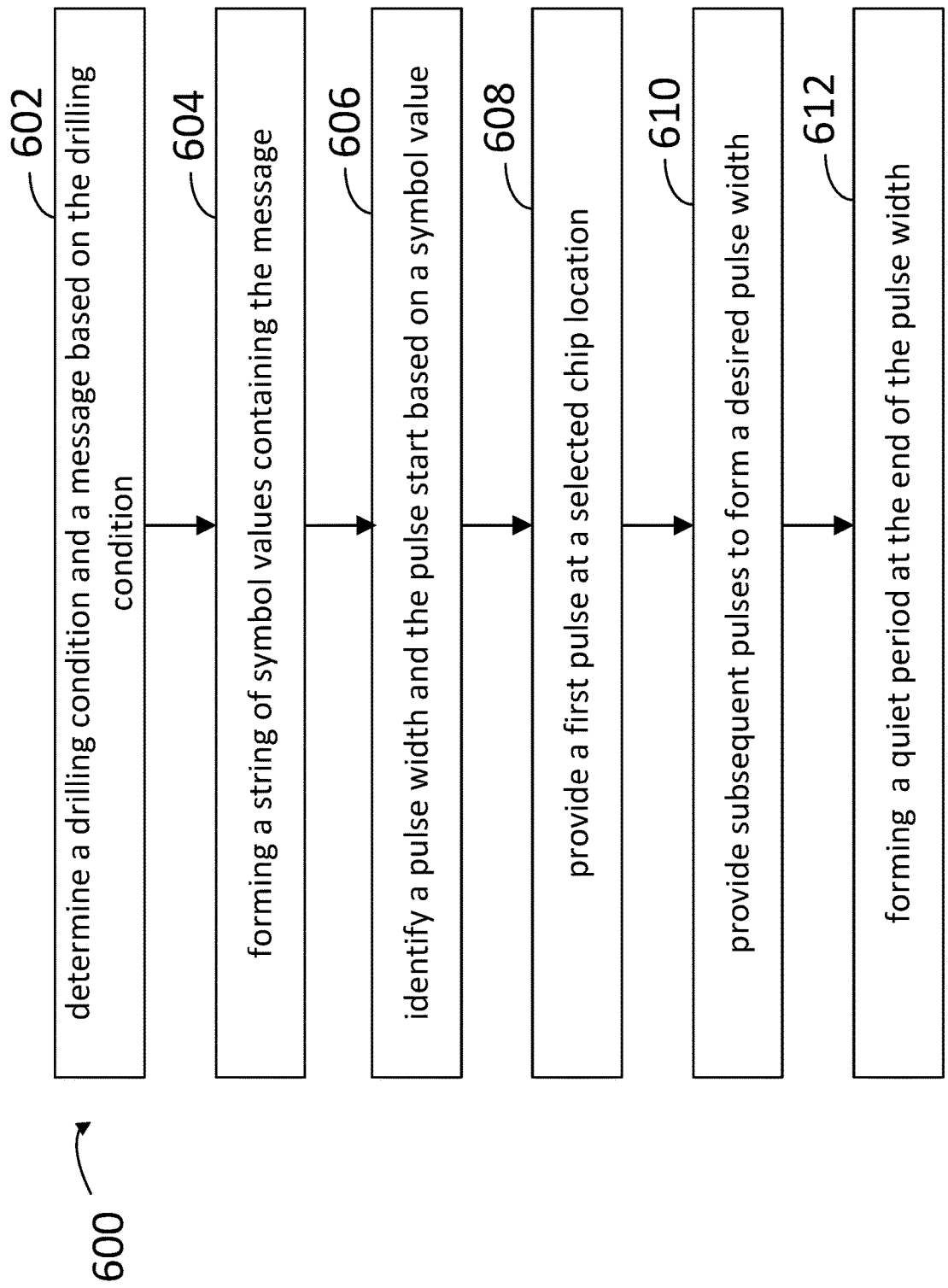
FIG. 6 illustrates a flow chart including steps in a method for digital signal processing in mud pulse telemetry, according to some embodiments.

FIG. 6 illustrates a flow chart including steps in a method 600 for filtering pump interference in mud pulse telemetry, according to some embodiments. Method 600 may be performed in the context of a drilling system including a drilling rig supporting a drill string coupled to a drill tool forming an underground wellbore (e.g., drilling system 100, drilling rig 150, drill string 133, drill tool 130, and wellbore 120, cf. FIG. 1). In the drilling system, an acoustic transducer near the drill tool may transmit messages between a controller in the surface and the drill tool (e.g., acoustic transducer 102 and controller 110, cf. FIG. 1). The messages may be transmitted through a mud flow and received at the surface by a pressure sensor, the mud flow being pressurized by a pump at the surface (e.g., mud flow 125, pressure sensor 101, and pump 105, cf. FIG. 1).

The messages may be transmitted through a mud flow and received at the downhole by an acoustic transducer, the mud flow being pressurized by a pump at the surface (e.g., mud flow 125, acoustic transducer 102, and pump 105, cf. FIG. 1). The messages in method 600 may include a string of symbols having values according to signal processing methods such as Gray code mapping. Specifically, some embodiments of method 600 use PPM and PWM schemes with Gray code mapping. More generally, methods consistent with method 600 may incorporate any digital signal processing protocol used in the telecommunication industry.

The symbols in method 600 may include a waveform having a selected length spanning a period of time $T_{symbol}$ divided into an integer number of sub-periods, or 'chips,' each spanning a time $T_{chip}$ (e.g., $T_{symbol}$ 201 and $T_{chip}$ 202, cf. FIG. 2). Other parameters used to describe waveforms defining symbols in method 500 include a number, K, of bits used by the symbol, a pulse time $T_{pulse}$, and a quiet period $T_q$, after each pulse (e.g., $T_{pulse}$ 211, and $T_q$ 212, cf. FIG. 2).

Steps in methods consistent with method 600 may be at least partially performed by a computer system having a processor circuit executing commands stored in a memory circuit (e.g., computer system 400, processor circuit 402, and memory circuit 404, cf. FIG. 4). Methods consistent with method 600 may include at least one but not all of the steps in FIG. 6, performed in any order. More generally, methods consistent with the present disclosure may include at least some of the steps in FIG. 6 performed overlapping in time. For example, some embodiments may include at least two steps in FIG. 6 performed simultaneously, or almost simultaneously, in time.

Step 602 includes determining a drilling condition and a message based on the drilling condition. For example, the message may include changing the drilling condition based on at least one measurement parameter obtained by determining the drilling condition. In some embodiments, step 602 may include determining the drilling condition includes a vertical drilling configuration and determining a message to steer the drilling configuration to a horizontal or almost horizontal configuration.

Step 604 includes forming a string of symbol values containing the message. In some embodiments, step 604 may include selecting the number, k, of bits in a binary code for each of the symbols in the message.

Step 606 includes identifying a pulse width and a pulse start based on the symbol value. In some embodiments, step 604 may include using a Gray code mapping to establish a one-to-one correlation between a symbol waveform and a symbol value. Step 608 includes providing a first pulse at a selected chip location. Accordingly step 608 may include selecting the $T_{start}$ value for the pulse, according to a combined PPM and PWM scheme. Step 610 includes providing subsequent pulses to form a desired pulse width. Accordingly, step 610 may include selecting the $T_{pulse}$ value in the combined PPM and PWM scheme. Step 612 includes forming the quiet period, $T_q$, at the end of the pulse width. Step 612 may include forming a $T_q$ lasting for at least one chip after the last pulse in a waveform forming the symbol.

It is recognized that the various embodiments herein directed to computer control and artificial neural networks, including various blocks, modules, elements, components, methods, and algorithms, can be implemented using computer hardware, software, combinations thereof, and the like. To illustrate this interchangeability of hardware and software, various illustrative blocks, modules, elements, components, methods and algorithms have been described generally in terms of their functionality. Whether such functionality is implemented as hardware or software will depend upon the particular application and any imposed design constraints. For at least this reason, it is to be recognized that one of ordinary skill in the art can implement the described functionality in a variety of ways for a particular application. Further, various components and blocks can be arranged in a different order or partitioned differently, for example, without departing from the scope of the embodiments expressly described.

Computer hardware used to implement the various illustrative blocks, modules, elements, components, methods, and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), erasable read only memory (EPROM)), registers, hard disks, removable disks, CD-ROMs, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM, and flash EPROM.

The exemplary embodiments described herein are well adapted to attain the ends and advantages mentioned as well as those that are inherent therein. The particular embodiments disclosed above are illustrative only, as the exemplary embodiments described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The disclosure illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

What is claimed is:

1. A method, comprising:
    forming a string of symbol values encoding a message that is based on a determined drilling condition;
    mapping each symbol value of the string of symbol values to a symbol waveform in a Gray code of symbol waveforms;
    selecting one or more of the mapped symbol waveforms based, at least in part, on a symbol time period; and
    for each of the selected one or more of the mapped symbol waveforms,
        identifying a pulse width and a pulse start,
        providing a set of one or more pulses according to the pulse width and starting at a selected chip location corresponding to the pulse start, and
        forming a quiet period at an end of the set of one or more pulses, wherein the quiet period is at least a recharging time for a battery or a capacitor in a pressure sensor or acoustic transducer.

2. The method of claim 1, wherein providing the set of one or more pulses starting at the selected chip location comprises providing a pressure signal to an acoustic transducer in a wellbore of a drilling system.

3. The method of claim 1, wherein providing the set of one or more pulses according to the pulse width comprises providing more than a minimum value of pulses for the pulse width.

4. The method of claim 1, wherein forming the quiet period at the end of the set of one or more pulses comprises forming a quiet period of one chip or more after the set of one or more pulses.

5. The method of claim 1, further comprising selecting the chip location and the pulse width according to at least one of a pulse-position-modulation (PPM) and a pulse-width-modulation (PWM) scheme.

6. The method of claim 1, wherein identifying the pulse width and the pulse start comprises selecting a pulse value from a number of values in a binary code having a selected number of bits.

7. The method of claim 1, wherein identifying the pulse width and the pulse start comprises correlating the mapped symbol waveform with the pulse width and the pulse start using the Gray code of symbol waveforms.

8. The method of claim 1, wherein the message that is based on the determined drilling condition comprises a message to change the determined drilling condition based on at least one measurement parameter.

9. A device, comprising:
    a memory circuit storing commands; and
    a processor circuit configured to execute the commands and cause the device to,
    form a string of symbol values encoding a message that is based on a determined drilling condition,
    map each symbol value of the string of symbol values to a symbol waveform in a Gray code of symbol waveforms,
    select one or more of the mapped symbol waveforms based, at least in part, on a symbol time period, and
    for each of the selected one or more of the mapped symbol waveforms,
        identify a pulse width and a pulse,
        provide a set of one or more pulses according to the pulse width and starting at a selected chip location corresponding to the pulse start, and
        form a quiet period at an end of the set of one or more pulses, wherein the quiet period is at least a recharging time for a battery or a capacitor in a pressure sensor or acoustic transducer.

10. The device of claim 9, wherein the commands to cause the device to provide the set of one or more pulses starting at the selected chip location comprise commands to cause the device to provide a pressure signal to an acoustic transducer in a wellbore of a drilling system.

11. The device of claim 9, wherein the commands to cause the device to provide the set of one or more pulses according to the pulse width comprise commands to cause the device to provide more than a minimum value of pulses for the pulse width.

12. The device of claim 9, wherein the commands to cause the device to form the quiet period at the end of the set of one or more pulses comprise commands to cause the device to form a quiet period of one chip or more after the set of one or more pulses.

13. The device of claim 9, further comprising commands to cause the device to select the chip location and the pulse width according to at least one of a pulse-position-modulation (PPM) and a pulse-width-modulation (PWM) scheme.

14. The device of claim 9, wherein the commands to cause the device to identify the pulse width and the pulse start comprise commands to cause the device to select a pulse value from a number of values in a binary code having a selected number of bits.

15. The device of claim 9, wherein the commands to cause the device to identify the pulse width and the pulse start comprise commands to cause the device to correlate the mapped symbol waveform with the pulse width and the pulse start using the Gray code of symbol waveforms.

16. The device of claim 9, wherein the commands to cause the device to form the message based on the determined drilling condition comprise commands to cause the device to change the determined drilling condition based on at least one measurement parameter.

17. One or more non-transitory machine-readable media comprising program code for signal processing in mud pulse telemetry, the program code to:

form a string of symbol values encoding a message that is based on a determined drilling condition;

map each symbol value of the string of symbol values to a symbol waveform in a Gray code of symbol waveforms;

select one or more of the mapped symbol waveforms based, at least in part, on a symbol time period; and for each of the selected one or more of the mapped symbol waveforms,
  identify a pulse width and a pulse,
  provide a set of one or more pulses according to the pulse width and starting at a selected chip location corresponding to the pulse start, and
  form a quiet period at an end of the set of one or more pulses, wherein the quiet period is at least a recharging time for a battery or a capacitor in a pressure sensor or acoustic transducer.

18. The one or more non-transitory machine-readable media of claim 17, wherein the program code to provide the set of one or more pulses starting at the selected chip location comprises program code to provide a pressure signal to an acoustic transducer in a wellbore of a drilling system.

19. The one or more non-transitory machine-readable media of claim 17, wherein the program code to provide the set of one or more pulses according to the pulse width comprises program code to provide more than a minimum value of pulses for the pulse width.

20. The one or more non-transitory machine-readable media of claim 17, wherein the program code to form the quiet period at the end of the set of one or more pulses comprises program code to form a quiet period of one chip or more after the set of one or more pulses.

* * * * *